United States Patent
Kang et al.

(10) Patent No.: US 8,023,323 B2
(45) Date of Patent: Sep. 20, 2011

(54) NON-VOLATILE MEMORY DEVICE HAVING MONITORING MEMORY CELL AND RELATED METHOD OF DRIVING USING VARIABLE READ VOLTAGE

(75) Inventors: Sang-gu Kang, Suwon-si (KR); Young-ho Lim, Yongin-si (KR)

(73) Assignee: Samsung Electronics Co., Ltd., Suwon-si Gyeonggi-do (KR)

( * ) Notice: Subject to any disclaimer, the term of this patent is extended or adjusted under 35 U.S.C. 154(b) by 577 days.

(21) Appl. No.: 12/023,239

(22) Filed: Jan. 31, 2008

(65) Prior Publication Data

US 2008/0192541 A1    Aug. 14, 2008

(30) Foreign Application Priority Data

Feb. 13, 2007 (KR) .................. 10-2007-0015085

(51) Int. Cl.
*G11C 11/34* (2006.01)

(52) U.S. Cl. ......... 365/185.03; 365/185.17; 365/185.18; 365/185.2; 365/185.21; 365/185.24; 365/185.29; 365/185.33

(58) Field of Classification Search ............. 365/185.03, 365/185.17, 185.18, 185.21, 185.24, 185.29, 365/185.33, 185.2

See application file for complete search history.

(56) References Cited

U.S. PATENT DOCUMENTS

| 6,307,783 | B1 * | 10/2001 | Parker | 365/185.03 |
| 6,614,683 | B1 * | 9/2003 | Parker | 365/185.03 |
| 6,687,155 | B2 * | 2/2004 | Nagasue | 365/185.03 |
| 6,836,431 | B2 * | 12/2004 | Chang | 365/185.03 |
| 7,126,850 | B2 * | 10/2006 | Tatsukawa et al. | 365/185.03 |
| 7,193,896 | B2 * | 3/2007 | Shiga | 365/185.03 |
| 7,315,471 | B2 * | 1/2008 | Shibata et al. | 365/185.03 |
| 7,405,977 | B2 * | 7/2008 | Lee et al. | 365/185.03 |
| 7,542,350 | B2 * | 6/2009 | Park et al. | 365/185.33 |
| 7,684,255 | B2 * | 3/2010 | Kim et al. | 365/185.03 |
| 7,729,165 | B2 * | 6/2010 | Wang | 365/185.03 |

FOREIGN PATENT DOCUMENTS

| JP | 2006114078 | 4/2006 |
| KR | 1020040052409 A | 6/2004 |
| KR | 1020060024149 A | 3/2006 |

* cited by examiner

*Primary Examiner* — Trong Phan (74) *Attorney, Agent, or Firm* — Volentine & Whitt, PLLC (57) ABSTRACT

A non-volatile memory device and related method of driving data are disclosed. The non-volatile memory device includes an array of multi level cells and a monitoring memory cell. The method of driving including performing a preliminary read operation with respect to a monitoring memory cell using a first read voltage, determining whether data initially stored in the monitoring memory cell is identical with data read from the monitoring memory cell during the preliminary read operation, and setting a main read voltage to a level different from the level of the first read voltage when the data initially stored in the monitoring memory cell is not identical with the data read from the monitoring memory cell in relation to the first read voltage.

30 Claims, 7 Drawing Sheets

NON-VOLATILE MEMORY DEVICE HAVING MONITORING MEMORY CELL AND RELATED METHOD OF DRIVING USING VARIABLE READ VOLTAGE

CROSS-REFERENCE TO RELATED PATENT APPLICATION

This application claims the benefit of Korean Patent Application No. 10-2007-0015085 filed on Feb. 13, 2007, the subject matter of which is hereby incorporated by reference.

BACKGROUND OF THE INVENTION

1. Field of the Invention

The present invention relates to non-volatile memory devices and methods of driving same. More particularly, the invention relates to a non-volatile memory device that varies the level of a read voltage in response to variations in the distribution of a threshold voltage of a memory cell, as well as related methods of driving the non-volatile memory device.

2. Description of the Related Art

With the development of mobile consumer electronics and a variety of related applications, the demand for flash memory, one common form of non-volatile memory, is increasing. Flash memory is an electrically erasable and programmable non-volatile memory device that is able to retain stored data even when power is interrupted. A given quantity of data may be stored in flash memory using less power than that required to the same quantity of data in other conventional storage media, such as magnetic disc memory (i.e., hard disk drives or HDDs). Flash memory is also able to access stored data faster than HDD based memory systems.

Conventional flash memory is classified into NOR type and NAND type according to logical connection between the constituent memory cells and bit lines. NOR flash memory is formed by connecting at least two cell transistors to each bitline in parallel, and stores data using a channel hot electron method and erases data using a Fowler-Nordheim (F-N) tunneling method. NAND flash memory is formed by serially connecting at least two cell transistors to each bitline, and stores and erases data using an F-N tunneling method. In general, NOR flash memory is less capable of being densely integrated and consumes relatively more current, but also provides a relatively higher operating speed. On the other hand, NAND flash memory may be very densely integrated and consumes relatively less cell current than NOR flash memory.

Various multi level cell (MLC) architectures and related operating methods have been proposed to increase the overall data storage capacity of flash memory. Use of MLC allows a single memory cell to be programmed according to defined threshold voltages such the memory cell is able to store at least two bits of data. In contrast, flash memory using single level memory cells (SLC) store only one bit per memory cell.

Figure 1A:
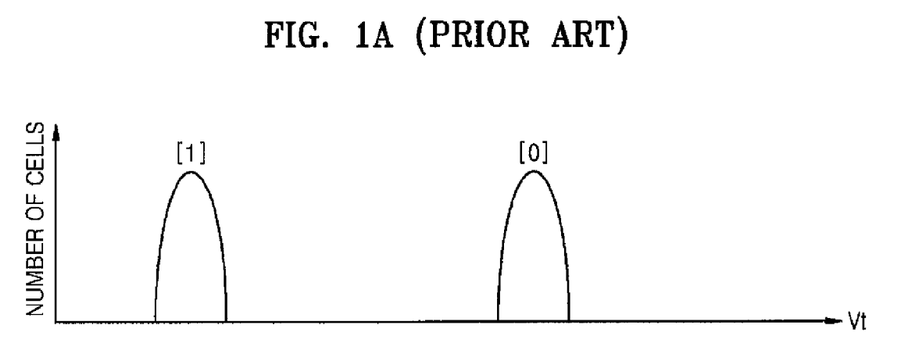
FIG. 1A is a graph showing a distribution of a threshold voltage of a single level cell.

FIG. 1A is a graph showing an exemplary threshold voltage distribution for a SLC. Since the SLC stores only one bit of data, the defined threshold voltages need only indicate two data states, [0] and [1]. In order to read the data value stored by memory cell of a SLC type flash memory, a single read voltage may be applied to a wordline associated with the memory cell. The read voltage has a value somewhere between the two threshold voltage distributions and is sufficient to discriminate the stored data value.

Figure 1B:
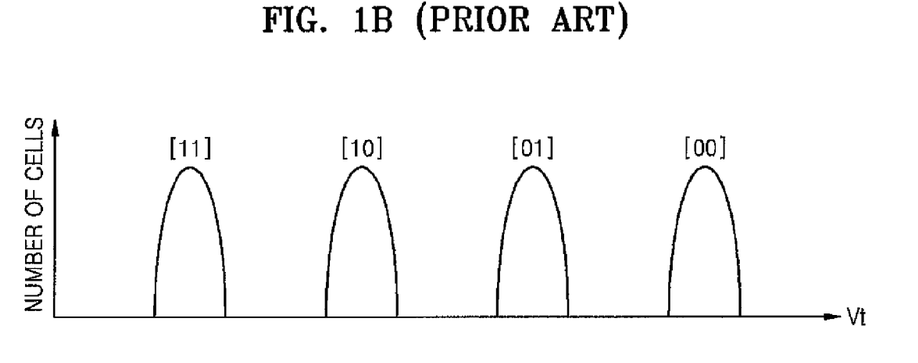
FIG. 1B is a graph showing a distribution of a threshold voltage of a multi level cell.

FIG. 1B is a graph showing an exemplary threshold voltage distribution for a MLC. More particularly, FIG. 1B illustrates a case where two bits of data are stored in a single memory cell. Since the MLC stores two-bit data, the defined threshold voltages must indicate four data states, [00], [01], [10], and [11]. It follows that in order to read data from a memory cell in a MLC type flash memory, three read voltages are needed.

In a SLC type flash memory, each memory cell may be programmed into one of two states using threshold voltage distributions that ensure a large discrimination (or read) margin between data states. In contrast, the read margins between respective data states for memory cells in a MLC type flash memory are greatly reduced. That is, respective adjacent threshold voltage distributions indicating the different data states are relatively close together.

Generally speaking, the threshold voltage of a flash memory cell varies in accordance with the quantity of electrical charge (i.e., electrons) stored on its floating gate. Unfortunately, electrons stored on a floating gate tend to dissipate or "leak" over time. In extreme cases, charge leakage may actual alter the threshold voltage of a programmed memory cell, thereby changing the stored data value. Due to the reduced read margins noted above, MLC memory systems are particularly susceptible to problems associated with charge leakage. The ability of a particular memory cell to retain charge over time is referred to as its retention characteristic. The retention characteristic of a memory cell is a reliability index of sorts.

Figure 2:
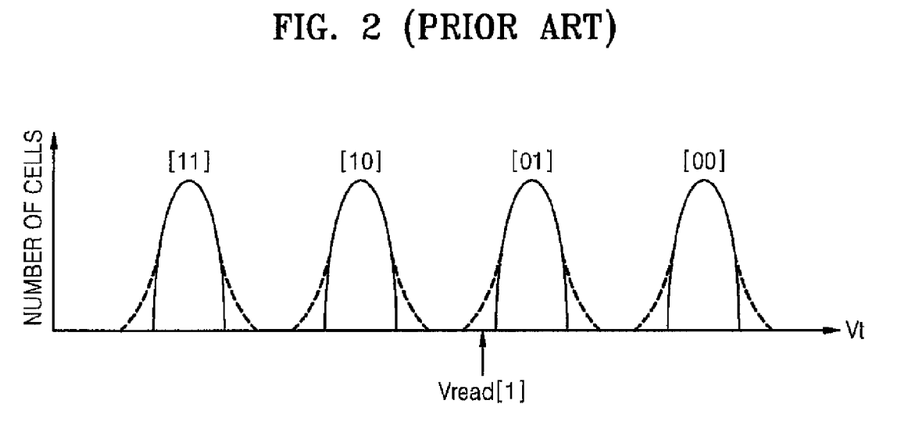
FIG. 2 is a graph showing changes of threshold voltages according to electron leakage in a multi level cell of a conventional non-volatile memory device.

FIG. 2 is a graph showing possible changes to the exemplary threshold voltage distributions of FIG. 1B as a result of charge leakage. As stored electrons dissipate from a floating gate with the passage of time, the threshold voltage distributions tend to shift or broaden. At some point, such shifting or broadening of the threshold voltage distributions substantially increase the likelihood of an erroneous data discrimination. For example, if a fixed read voltage, Vread[1], intended to distinguish the data values [10] and [01] is applied to the MLC of FIG. 2, the lower end of the broadened threshold voltage distribution for data [01] may fall below the read voltage Vread[1] due to charge leakage. Memory cells characterized by shifted or broadened threshold voltages are more likely to result in erroneous data interpretations. In conventional flash memory, a fixed read voltage is routinely used to discriminate stored data values even when the distribution of one or more threshold voltages for the memory cell is changed due to charge leakage. This approach is likely to result in errant data reads.

SUMMARY OF THE INVENTION

The present invention provides non-volatile memory devices enjoying improved data retention for constituent memory cells and minimizing the generation of data read errors, and related methods of driving same.

In one embodiment, the invention provides a method of driving a non-volatile memory device including an array of multi level cells and a monitoring memory cell, the method comprising; performing a preliminary read operation with respect to a monitoring memory cell using a first read voltage, determining whether data initially stored in the monitoring memory cell is identical with data read from the monitoring memory cell during the preliminary read operation, and setting a main read voltage to a level different from the level of the first read voltage when the data initially stored in the monitoring memory cell is not identical with the data read from the monitoring memory cell in relation to the first read voltage.

In another embodiment, the invention provides a method of driving a non-volatile memory device including an array of multi level cells, the method comprising; applying a first read voltage to a first wordline associated with a first programming unit and a corresponding first monitoring memory cell within a memory cell array, performing a read operation with respect to the first programming unit and the first monitoring memory cell using the first read voltage, determining whether data initially stored in the first monitoring memory cell is identical with data read from the first monitoring memory cell in relation to the first read voltage, and performing a main read operation with respect to the first programming unit by setting a main read voltage to a level different from the level of the first read voltage and by providing the main read voltage to the first wordline, when the data initially stored in the monitoring memory cell is not identical with the data read from the first monitoring memory cell in relation to the first read voltage.

In another embodiment, the invention provides a non-volatile memory device including multi level cells, the non-volatile memory device comprising; a memory cell array comprising a monitoring memory cell, a wordline voltage generation unit generating a wordline voltage applied to the memory cell array, a data comparison unit receiving read data from the monitoring memory cell in relation to a first read voltage and comparing the read data to reference data, and generating a corresponding comparison signal, and a controller defining the level of the wordline voltage in response to the comparison signal.

DESCRIPTION OF EMBODIMENTS

The present invention will now be described more fully with reference to the accompanying drawings, in which exemplary embodiments of the invention are shown.

Figure 3:
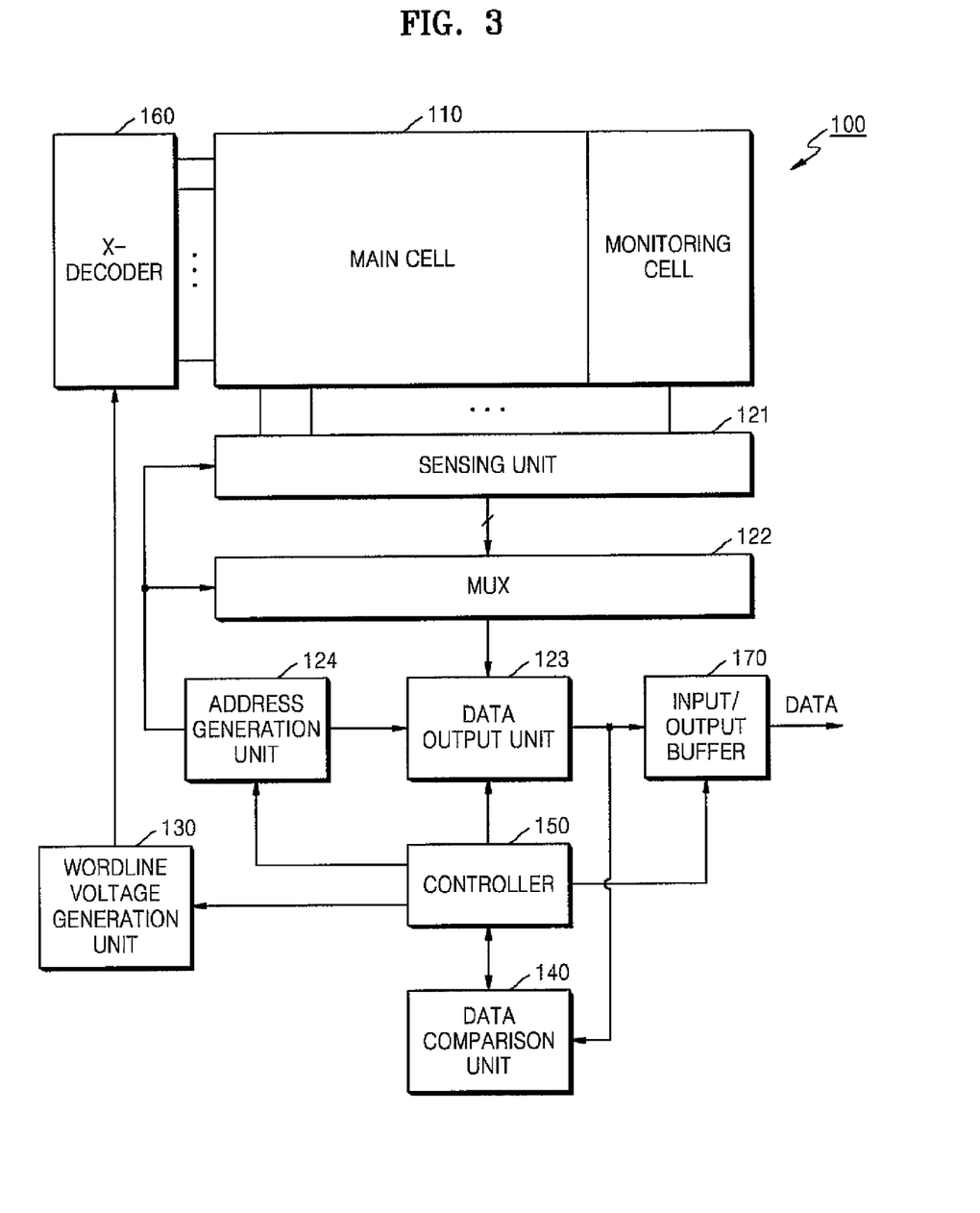
FIG. 3 is a block diagram of a non-volatile memory device according to an embodiment of the invention.

FIG. 3 is a block diagram of a non-volatile memory device 100 according to an embodiment of the invention. As illustrated in FIG. 3, the non-volatile memory device 100 comprises a memory cell array 110, a wordline voltage generation unit 130, a data comparison unit 140, and a controller 150. In order to perform the operations of programming, reading, erasing, etc., non-volatile memory device 100 further comprises a sensing unit 121, a multiplexer (MUX) 122, a data output unit 123, an address generation unit 124, a row decoder, that is, an X-decoder 160, and an input/output buffer 170.

Memory cell array 110 comprises a main memory cell array and a monitoring memory cell. The main memory cell array and the corresponding monitoring memory cell may be programmed by one of a plurality of threshold voltages capable of storing at least two bits of data per memory cell. For example, when each memory cell in the main memory cell array and the corresponding monitoring memory cell is a MLC storing two-bit data, each memory cell may be programmed using one of four threshold voltages.

Memory cell array 110 includes at least one monitoring memory cell. The threshold voltages of the memory cells in memory cell array 110 may vary over time due to charge leakage from respective floating gates. When variation of a threshold voltage for the monitoring memory cell is sensed, said variation is deemed to be indicative of similar variations in the threshold voltage of the memory cells within memory cell array 110.

For example, when one or more main memory cells connected to a single wordline in non-voltage memory device 100 is defined as a "programming unit", a corresponding monitoring memory cell may be identified in relation to the programming unit. Hereafter, the term "monitoring memory cell" will be used to indicate one or more physical cells that correspond to a defined programming unit within the main memory cell array or to some other portion of the main memory cell array. A single monitoring memory cell programmed by one of a plurality of threshold voltages, or a plurality of monitoring memory cells programmed by the threshold voltages may serve as a "monitoring memory cell".

The monitoring memory cell may be arranged in any reasonable portion of memory cell array 110. For example, the monitoring memory cell may be arranged in a specially partitioned area of memory cell array 110.

Sensing unit 121 senses and amplifies data read from memory cell array 110 and outputs the sensed and amplified data. MUX 122 receives the sensed and amplified data from sensing unit 121, multiplexes the received data, and outputs the multiplexed data to data output unit 123. Data output unit 123 outputs the data received from MUX 122 to input/output buffer 170. Input/output buffer 170 buffers the received data and outputs the buffered data to the outside. Address generation unit 124 provides addresses to sensing unit 121, MUX 122, data output unit 123, etc., in order to perform the series of operations described above.

Wordline voltage generation unit 130 generates voltages applied to wordlines associated with at least memory cell array 110. The wordline voltages generated by wordline voltage generation unit 130 are provided to row decoder 160. Row decoder 160 provides the wordline voltages to the wordlines of memory cell array 110 in response to received address signals (not shown).

Data comparison unit 140 receives the result of the read operation directed to data stored in the monitoring memory cell and compares the read data with reference data (i.e., a predetermined data value). More specifically, because information about data initially stored in the monitoring memory cell can be recognized, data comparison unit 140 can include information about a reference output value corresponding to an ideal result of a read of the initially stored data. Data comparison unit 140 determines whether data read from the monitoring memory cell is identical with the initially stored data by comparing the result of the read data from the monitoring memory cell with the reference output value, and outputs a comparison signal corresponding to the result of the comparison.

Controller 150 receives the comparison signal from data comparison unit 140 and controls wordline voltage generation unit 130 in response to the comparison signal. In particular, when wordline voltage generation unit 130 generates a read voltage during a read operation applied to memory cell array 110, controller 150 controls wordline voltage generation unit 130 to change the level of the read voltage in response to the comparison signal.

A read operation for non-volatile memory device 100 having such a structure will now be described with reference to FIG. 4. In an embodiment of the invention illustrated in FIG. 4, it is assumed that a plurality of four (4) monitoring memory cells is arranged in relation to four defined programming units respectively associated with data states 11, 10, 01, and 00.

Figure 4:
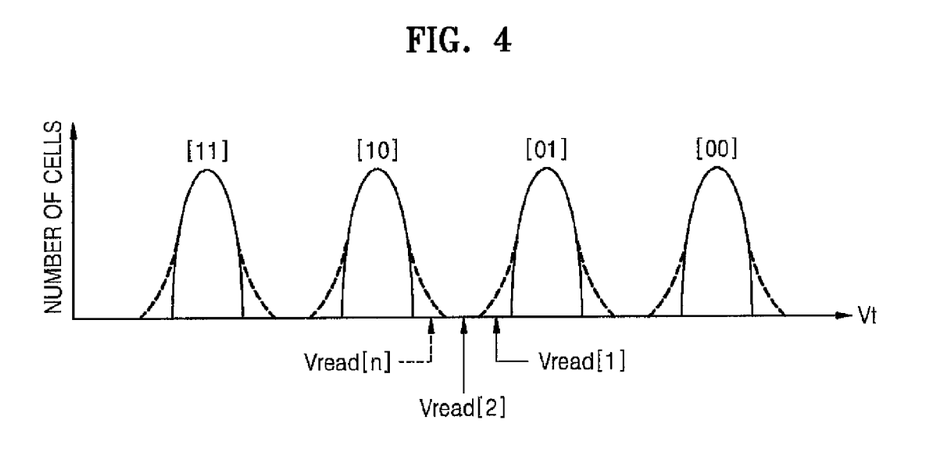
FIG. 4 is a graph showing an example in which a main read voltage is set in response to a variation of a threshold voltage distribution.

FIG. 4 is a graph showing an example in which a read voltage is set in response to a sensed variation in a threshold voltage distribution. For example, three (3) read voltages are needed to discriminate two-bit data stored in the MLCs of memory cell array 110. One approach to the setting of a read voltage distinguishing between data states 10 and 01 will now be described.

First, a preliminary read operation is performed on a monitoring memory cell before a main read operation is performed. A mode for setting the read voltage in response to a sensed change in the threshold voltage of the monitoring memory cell is performed.

When the read voltage setting mode is entered, wordline voltage generation unit 130 generates a first read voltage, Vread[1], which is provided to a first wordline of memory cell array 110. Accordingly, a read operation is performed on memory cells connected to the first wordline.

According to an address generated by address generation unit 124, the result of the read operation applied to a monitoring memory cell associated with the first wordline is provided to data comparison unit 140 via sensing unit 121, MUX 122, and data output unit 123. More specifically, the result of the read operation applied to the monitoring memory cell which initially stores 01 data is provided to data comparison unit 140. Data comparison unit 140 includes information about a reference output value corresponding to the 01 data initially stored in the monitoring memory cell. Data comparison unit 140 determines whether the data read from the monitoring memory cell is identical with the data initially stored in the monitoring memory cell and outputs a comparison signal corresponding to the result of the determination to controller 150.

When the threshold voltage of the monitoring memory cell is changed to a value less than the first read voltage Vread[1] due to, for example, charge leakage, as shown in FIG. 4, the read-out data value is determined to be different from the reference output value. Controller 150 controls wordline voltage generation unit 130 in response to the comparison signal. Under the control of controller 150, wordline voltage generation unit 130 generates a second read voltage Vread[2] with a level different from that of the first read voltage Vread[1]. The second read voltage Vread[2] is provided to the first wordline of memory cell array 110.

Then, a read operation with respect to the memory cells connected to the first wordline is performed using the second read voltage Vread[2]. Data comparison unit 140 determines whether the data read from the monitoring memory cell using the second read voltage Vread[2] is identical with the data initially stored in the monitoring memory cell.

When the second read voltage Vread[2] is less than the threshold voltage of the monitoring memory cell as shown in FIG. 4, the read-out data value is determined to be identical with the initially stored data value. Controller 150 sets the second read voltage Vread[2] as the main read voltage in response to the comparison signal. Controller 150 controls wordline voltage generation unit 130 so that the second read voltage Vread[2] is provided to the first wordline of memory cell array 110. Accordingly, a main read operation with respect to the memory cells connected to the first wordline is performed using the second read voltage Vread[2].

On the other hand, when the second read voltage Vread[2] is greater than the threshold voltage of the monitoring memory cell as shown in FIG. 4, the read-out data value is determined to be different from the initially stored data value. In this case, controller 150 controls wordline voltage generation unit 130 to generate a third read voltage Vread[3] (not shown) with a level different from that of the second read voltage Vread[2]. The process described above may be repeated using the third read voltage Vread[3], etc. When it is ultimately determined from the result of this iterative process that the read operation applied to the monitoring memory cell in relation to an n-th read voltage Vread[n] is identical to that of the data value initially stored in the monitoring memory cell, controller 150 sets the n-th read voltage Vread[n] as the desired read voltage. Thereafter, a read operation with respect to the main memory cell array connected to the first wordline is performed using the n-th read voltage Vread[n].

On the other hand, when the threshold voltage of the monitoring memory cell has a value greater than the first read voltage Vread[1] due to charge leakage from the monitoring memory cell, the data value read from the monitoring memory cell by using the first read voltage Vread[1] is determined to be identical with the data value initially stored in the monitoring memory cell. Controller 150 sets the first read voltage Vread[1] as the desired read voltage in response to the comparison signal. Thereafter, the first read voltage Vread[1] set as the main read voltage is provided to the first wordline of memory cell array 110 so that a read operation with respect to the main memory cell array connected to the first wordline may be performed.

When the read operation with respect to the main memory cell array connected to the first wordline is completed, the process described above is repeated to allow a read operation for the memory cells connected to a second wordline. In other words, wordline voltage generation unit 130 generates a first read voltage Vread[1]. The first read voltage Vread[1] is provided to the second wordline of memory cell array 110. Accordingly, a read operation directed to the memory cells connected to the second wordline is performed using the first read voltage Vread[1].

When the result of the read operation applied to the monitoring memory cell connected to the second wordline is provided to data comparison unit 140, data comparison unit 140 determines whether the result is identical to the data value initially stored in the monitoring memory cell. When the result of the read operation is determined to be identical with the data value initially stored in the monitoring memory cell, controller 150 sets the first read voltage Vread[1] as the desired read voltage in response to a comparison signal generated by data comparison unit 140. On the other hand, when the result of the read operation is determined to be different from the data value initially stored in the monitoring memory cell, controller 150 sets a main read voltage to a level different from that of the first read voltage Vread[1] in response to a comparison signal generated by data comparison unit 140.

Thereafter, a read operation directed to the memory cells connected to the second wordline is performed using the defined read voltage.

When memory cell array 110 comprises N wordlines, respective operations of setting read voltages for the third through n-th wordlines may follow the foregoing in similar manner. Thereafter, read operations directed to memory cells connected respectively to the third through n-th wordlines are performed using appropriately defined read voltages.

Thus, a non-volatile memory device 100 including MLCs requires a plurality of appropriately defined read voltages. In one embodiment of the invention, a main read voltage is defined for each of the required read voltages. To achieve this, a plurality of monitoring memory cells are arranged to correspond to each programming unit and are programmed by respective threshold voltages that represent the various data states capable of being stored in the MLCs.

For example, when each of the MLCs stores 2-bit data, monitoring memory cells which initially store data values of 11, 10, 01, and 00 are arranged to correspond to a single programming unit. In this case, the monitoring memory cell which initially stores the data value of 10 undergoes a read operation, and a main read voltage for reading memory cells in the memory cell array storing data values of 10 is set using the foregoing data comparison operation. The monitoring memory cell which initially stores the data value of 01 undergoes a read operation, and a main read voltage corresponding 01 data is set using the data comparison operation. The monitoring memory cell which initially stores a data value of 00 undergoes a read operation, and a main read voltage corresponding to 00 data is set using the data comparison operation.

In a memory cell programmed using a relatively high threshold voltage, a greater amount of the stored charge may leak from the floating gate. Thus, in certain embodiments of the invention only a monitoring memory cell programmed by the highest threshold voltage may be arranged to correspond to a single programming unit. For example, a monitoring memory cell storing an initial data value of 00 may be arranged to correspond to each programming unit. In this case, the monitoring memory cell which initially stores the 00 data undergoes a read operation, and a main read voltage corresponding to 00 data is set using the data comparison operation. Also, the set main read voltage is used to read data 00 from the memory cells in the main memory cell array.

In the above-described embodiment, monitoring memory cells are arranged to correspond to the programming units of memory cell array 110 so that changes in the threshold voltages of the sensing cells represent changes in the threshold voltages of the corresponding programming units. However, the structure of the memory cell array 110 is not inherently limited within this embodiment.

For example, a monitoring memory cell may be arranged in a partitioned area of memory cell array 110 so that a change in the threshold voltage of the monitoring memory cell can represent a change in the threshold voltage of the entire memory cell array 110. In this case, a main read voltage is set according to a result of a read operation applied to the monitoring memory cell and provided to all of the wordlines of memory cell array 110 for reading predetermined data. The monitoring memory cell thus arranged in memory cell array 110 may be a plurality of cells that are programmed by a plurality of threshold voltages that represent multi levels as described above. Alternatively, the monitoring memory cell thus arranged in memory cell array 110 may be a single cell that is programmed with data of 00, or some other data state deemed particularly susceptible to charge leakage.

Figure 5A:
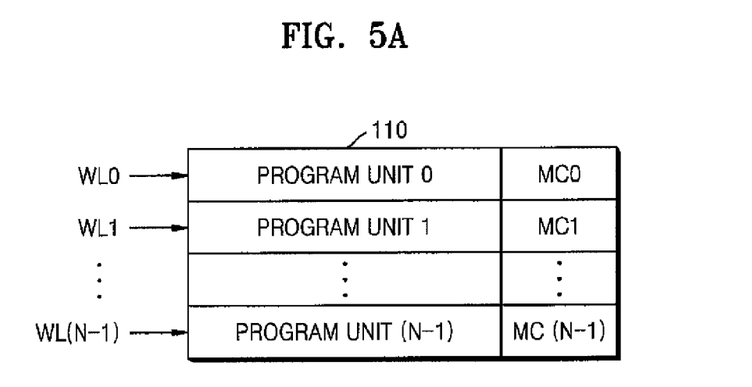
FIGS. 5A, 5B, and 5C are block diagrams of structures of memory cell arrays including monitoring memory cells.
Figure 5B:
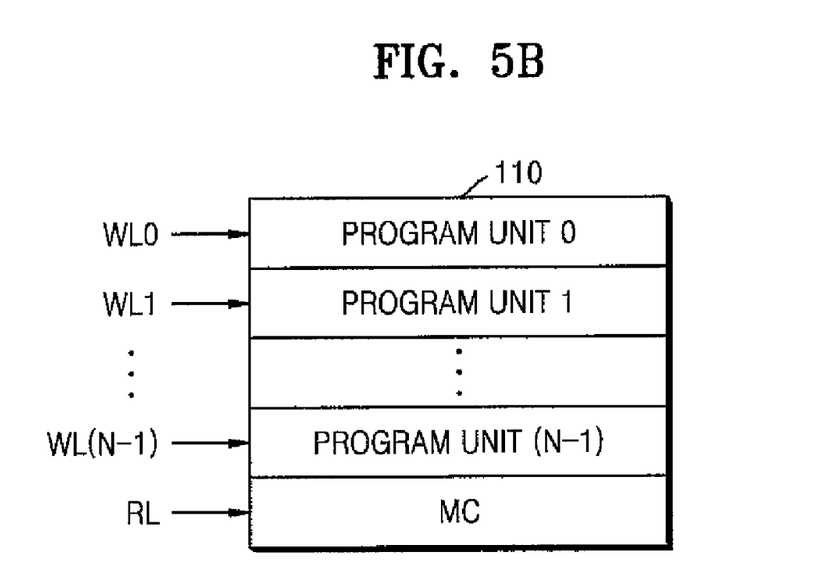
Figure 5C:
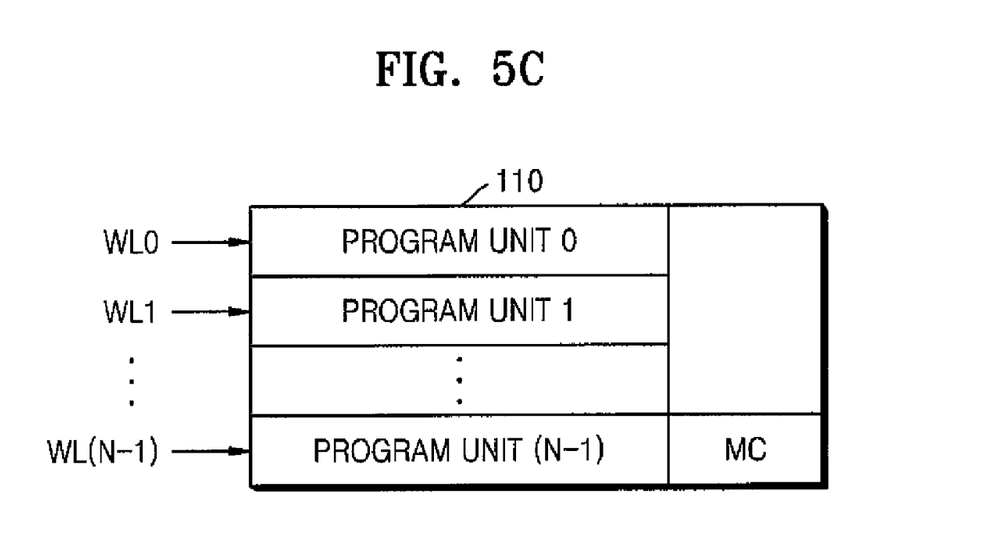

FIGS. 5A, 5B, and 5C are block diagrams illustrating different possible structures for memory cell array 110 including a monitoring memory cell. FIG. 5A illustrates memory cell array 110 including a corresponding number of monitoring memory cells to the number of programming units. As shown in FIG. 5A, memory cell array 110 may include N programming units, 0 through (N−1), and N monitoring memory cells MC0 through MC(N−1) corresponding to the N programming units. In this example, monitoring memory cells MC0 through MC(N−1) are disposed in a last column of memory cell array 110 as shown in FIG. 5A. Wordlines WL0 through WL(N−1) are connected to the respective programming units and the monitoring memory cells corresponding to the programming units. When the memory cell array 110 of FIG. 5A is installed, a main read voltage for the wordline WL0 is set using a result of the read data from the monitoring memory cell MC0, and is provided to the wordline WL0 to thereby perform a read operation on the programming unit 0. In this way, main read voltages for the N programming units are set and provided to the corresponding wordlines WL0 through WL(N−1) to thereby perform read operations for the N programming units. However, the location of these monitoring memory cells should not be limited to the last column of the memory cell array.

FIG. 5B illustrates another example of memory cell array 110. As shown in FIG. 5B, a memory cell array 110 includes N programming units 0 through (N−1) connected to wordlines WL0 through WL(N−1), and a monitoring memory cell connected to a monitoring wordline RL. In this example, the monitoring memory cell is disposed in a last row of memory cell array 110 as shown in FIG. 5B. When the memory cell array 110 of FIG. 5B is installed, data is read from the monitoring memory cell by applying a read voltage to the monitoring wordline RL, and a main read voltage is set using a result of this read operation. The main read voltage is applied to the wordlines WL0 through WL(N−1), and accordingly read operations on the N programming units 0 through (N−1) are performed. However, the location of the monitoring memory cell should not be limited to the last row of the memory cell array.

FIG. 5C illustrates another example of memory cell array 110. As shown in FIG. 5C, a memory cell array 110 includes N programming units 0 through (N−1) connected to wordlines WL0 through WL(N−1), and a monitoring memory cell connected to some of wordlines WL0 through WL(N−1) (for example, to the wordline WL(N−1)). In this example, the monitoring memory cell is disposed in a last column and a last row of memory cell array 110 as shown in FIG. 5C. In this case, data is read from the monitoring memory cell by applying a read voltage to the wordline WL(N−1), and a main read voltage is set using a result of the reading. The main read voltage is applied to the wordlines WL0 through WL(N−1), and accordingly read operations on the N programming units 0 through (N−1) are performed. However, the location of the monitoring memory cell should not be limited to the last column and the last row of the memory cell array.

Figure 6:
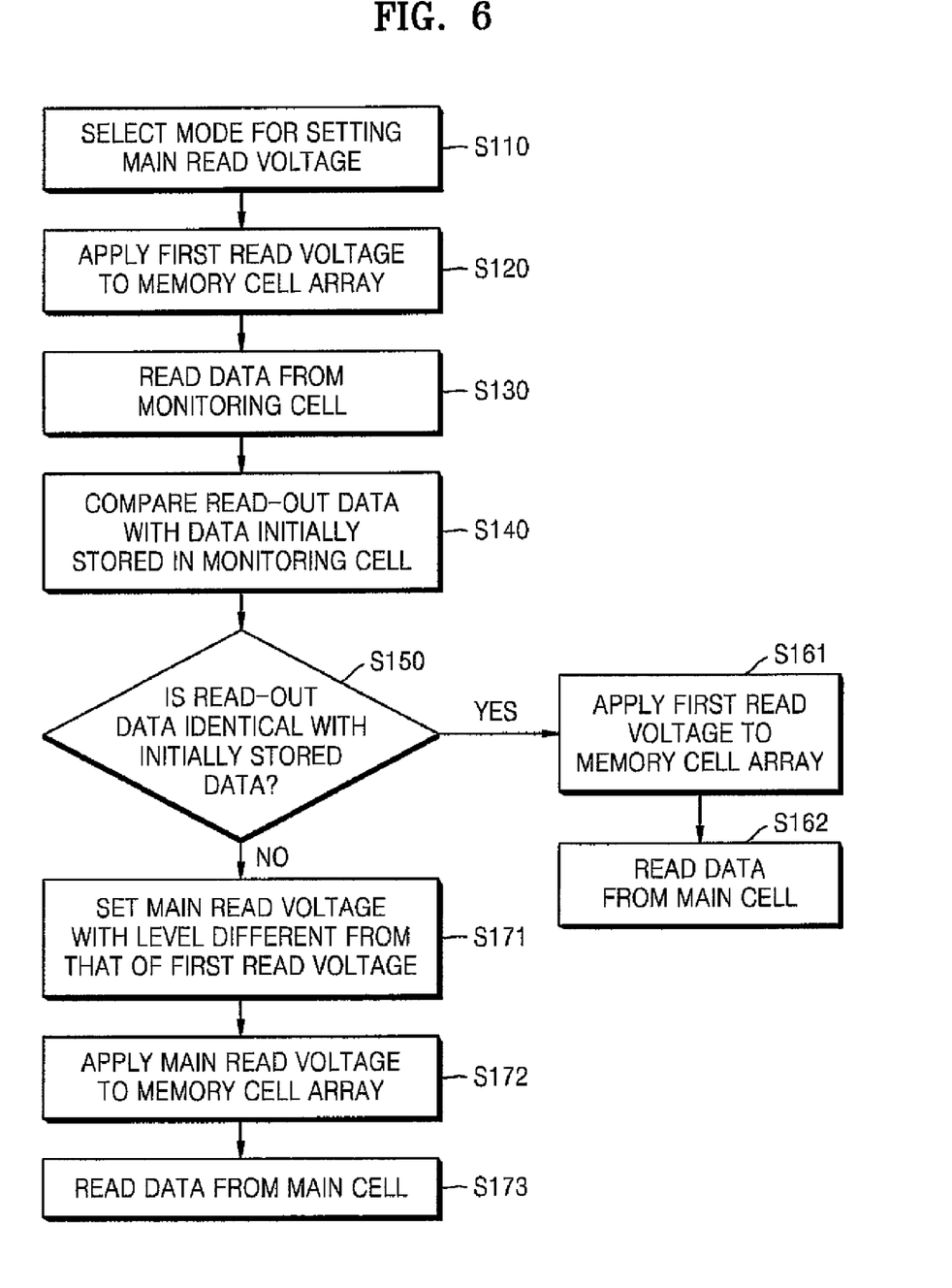
FIG. 6 is a flowchart summarizing a method of driving a non-volatile memory device, according to an embodiment of the invention.

FIG. 6 is a flowchart summarizing a method of driving a non-volatile memory device according to an embodiment of the invention. As shown in FIG. 6, first, a mode for setting a main read voltage is selected (S110). In order to selectively perform the mode for setting the main read voltage, a general mode changing member such as a fuse cutting, a bonding option, or a predetermined command may be installed.

When the mode is selected, a first read voltage is applied to a memory cell array (S120). The first read voltage is applied to a gate of a monitoring memory cell included in the memory cell array, and accordingly, data is read from the monitoring memory cell (S130).

Since information about data initially stored in the monitoring memory cell can be ascertained, a data value resulting from the read operation applied to the monitoring memory cell using a predetermined read voltage can also be ascertained. The resultant data value is a reference output value and is stored in the non-volatile memory device. The data initially stored in the monitoring memory cell is compared with data read from the monitoring memory cell by using the first read voltage by using the reference output voltage (S140). It is then determined from the comparison whether the data read from the monitoring memory cell is identical with the initially stored data (S150).

When it is determined that the data read from the monitoring memory cell is identical with the initially stored data, the first read voltage used to read data from the monitoring memory cell is set as a main read voltage, and the main read voltage is applied to the memory cell array (S161). Data is read from a main cell included in the memory cell array by using the main read voltage (S162).

On the other hand, when it is determined that the data read from the monitoring memory cell is different from the initially stored data, a read voltage with a level different from that of the first read voltage is set as a main read voltage (S171). The main read voltage is then applied to the memory cell array (S172). An operation of reading data from the main cell is then performed using the main read voltage (173).

The read voltage with a level different from that of the first read voltage may be pre-set. When it is determined that the data read from the monitoring memory cell is different from the initially stored data, the preset read voltage can be set as the main read voltage.

Alternatively, "n" read voltages may be pre-set, and a read operation directed to the monitoring memory cell using a first read voltage out of the "n" read voltages and a data comparison operation are performed. When it is determined that the data read from the monitoring memory cell is different from the initially stored data, the read operation and the comparison operation using a second read voltage are performed. This process is repeated to find a read voltage for a read operation that results in a data value that is identical with the initially stored data value. The identified read voltage may then be set as a main read voltage.

Figure 7:
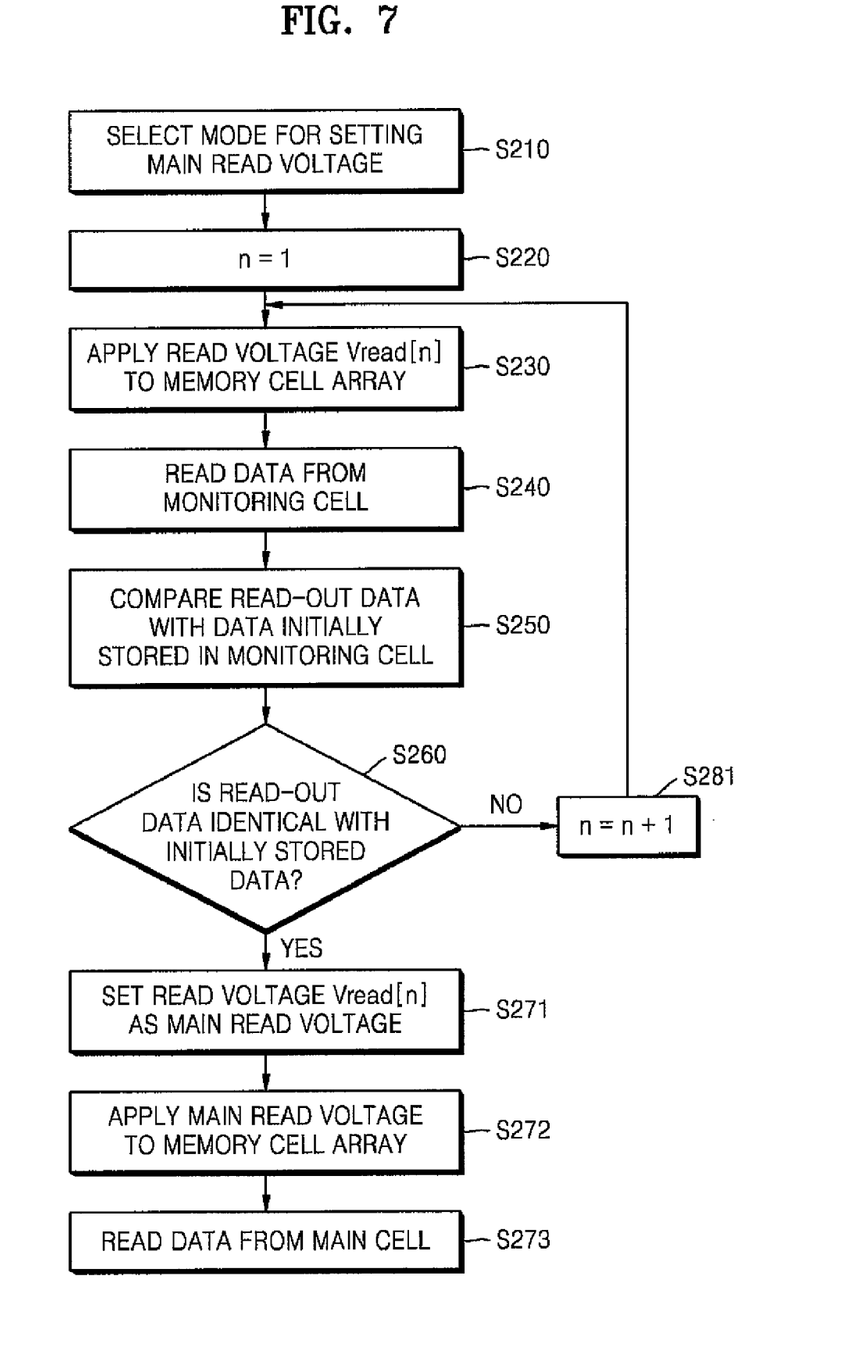
FIG. 7 is a flowchart summarizing a method of driving a non-volatile memory device, according to another embodiment of the invention.

FIG. 7 is a flowchart summarizing a method of driving a non-volatile memory device according to another embodiment of the invention. As shown in FIG. 7, first, a mode for setting a main read voltage is selected (S210). The value of "n" is set to be 1 (S220). A read voltage Vread[1] is then applied to the memory cell array (S230).

When the read voltage Vread[1] is applied to a memory cell array via a wordline, data is read from the monitoring memory cell connected to the wordline (S240). Data read from the monitoring memory cell using the read voltage Vread[1] is compared with the data initially stored in the monitoring memory cell (S250). It is then determined from the comparison whether the data read from the monitoring memory cell is identical with the initially stored data (S260).

When it is determined that the data read from the monitoring memory cell is identical with the initially stored data, the read voltage Vread[1] is set as a main read voltage (S271). The main read voltage is applied to the memory cell array (S272). Data is read from a main memory cell included in the memory cell array using the main read voltage applied to the memory cell array (S273).

On the other hand, when it is determined from the comparison that the data read from the monitoring memory cell is different from the initially stored data, "n" is incremented (S281), and a read voltage Vread[2] is applied to the memory cell array. Thereafter, using read voltage Vread[2] the illustrated method returns to steps S230 through S260. When it is determined that data read from the monitoring memory cell by using the read voltage Vread[2] is identical with the initially stored data, the read voltage Vread[2] is set as a main read voltage. On the other hand, when it is determined that the data read from the monitoring memory cell by using the read voltage Vread[2] is different from the initially stored data, the above-described process is repeated using a read voltage Vread[3], etc.

Figure 8:
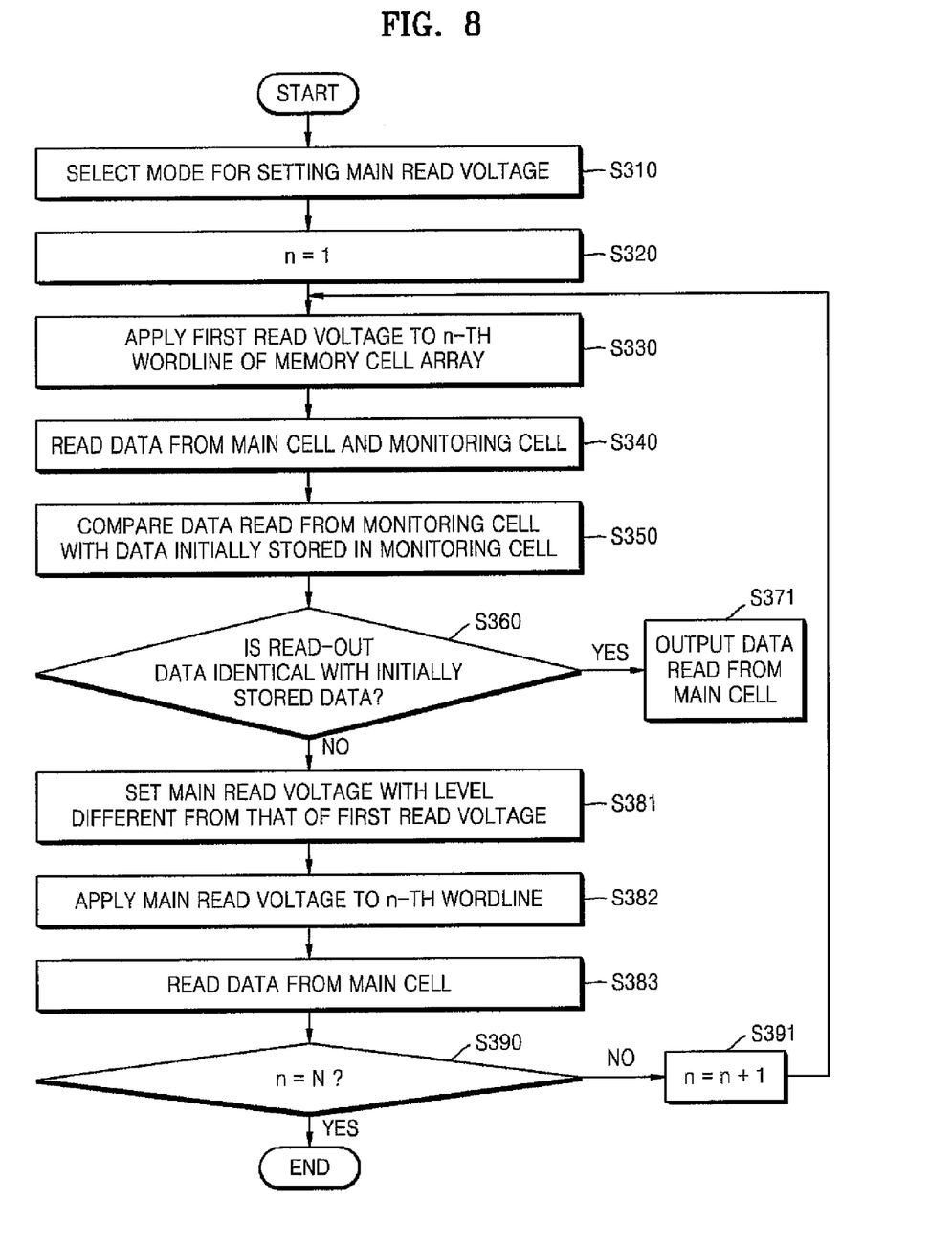
FIG. 8 is a flowchart summarizing a method of driving a non-volatile memory device, according to another embodiment of the invention.

FIG. 8 is a flowchart summarizing a method of driving a non-volatile memory device, according to another embodiment of the invention. First, a mode for setting a main read voltage is selected (S310). The value of "n" is set to be 1 (S320). A first read voltage is applied to a first wordline of a memory cell array (S330).

A main cell corresponding to a programming unit is connected to the first wordline, and a monitoring memory cell corresponding to the main cell is connected to the first wordline. As a first read voltage is applied to the wordline, data is read from the main cell and the monitoring memory cell that are connected to the wordline (S340).

Thereafter, data read from the monitoring memory cell is compared with the data initially stored in the monitoring memory cell (S350). It is then determined from the comparison whether the data read from the monitoring memory cell is identical with the initially stored data (S360).

When it is determined that the data read from the monitoring memory cell is identical with the initially stored data, data read from the main cell is output to the outside (S371). Accordingly, an operation of applying the first read voltage to the first wordline and an operation of re-reading data from the main cell can be omitted.

On the other hand, when it is determined that the data read from the monitoring memory cell is different from the initially stored data, a read voltage with a level different from that of the first read voltage is set as a main read voltage (S381). The main read voltage is then applied to the first wordline (S382). Accordingly, a read operation for the main memory cells connected to the first wordline is performed (S383).

When the operation of reading data from the main cell connected to the first wordline is completed, it is determined whether reading of data from all of the programming units included in the memory cell array have been completed (S390). When it is determined that the reading of data from all of the programming units has not been completed, the value of "n" is incremented (S391). Then, the first read voltage is applied to a second wordline of the memory cell array (S330) and the illustrated method returning through operations S340 through S390 with respect to the second wordline. The above-described process is repeated with respect to third through N-th wordlines, and thus data reading with respect to the entire memory cell array is completed.

As described above, a non-volatile memory device according to an embodiment of the invention can minimize the generation of errors during data read operations even when the level of a threshold voltage of a memory cell varies due to charge leakage, for example.

While the present invention has been particularly shown and described with reference to exemplary embodiments thereof, it will be understood by those of ordinary skill in the art that various changes in form and details may be made therein without departing from the scope of the invention as defined by the following claims.

What is claimed is:

1. A method of driving a non-volatile memory device including a memory cell array of multi level cells, each multi level cell being configured to store one of a plurality of data states including a first data state and a second data state, according to a corresponding plurality of threshold voltage distributions including a first threshold voltage distribution and an adjacent second voltage distribution, the method comprising:
designating a first portion of the memory cell array to include monitoring memory cells, and a second portion of the memory cell array to include programming units;
performing a first preliminary read operation directed to a monitoring memory cell storing a target data state, wherein the first preliminary read operation discriminates between the first data state and the second data state using a first read voltage having a first voltage level between the first threshold voltage distribution and the second voltage distribution;
comparing the target data state initially stored in the monitoring memory cell with a data state read from the monitoring memory cell during the first preliminary read operation; and
setting a main read voltage for reading the memory cells of the programming units responsive to said comparing.

2. The method of claim 1, further comprising:
after setting the main read voltage, performing a main read operation directed to at least one of the programming units using the main read voltage.

3. The method of claim 1, further comprising upon determining that the target data state is not the same as the data state read from the monitoring memory cell:
performing a second preliminary read operation directed to the monitoring memory cell using a second read voltage less than the first read voltage and having a second voltage level between the first threshold voltage distribution and the second voltage distribution; and
comparing the target data state with the data state read from the monitoring memory cell during the second preliminary read operation; and
setting the main read voltage to the second read voltage if the data state read from the monitoring memory cell during the second preliminary read operation is determined to be the same as the target data state.

4. The method of claim 1, wherein the target data state is the same as the first data state or the second data state.

5. The method of claim 3, wherein the memory cell array comprises N word lines arranged to connect the multi level cells, and the preliminary read operation is performed by respectively applying the first read voltage and then the second read voltage to each one of the N word lines in sequence to set a corresponding main read voltage for each one of the N word lines.

6. The method of claim 3, wherein the memory cell array comprises N word lines arranged to connect the multi level cells, and the method further comprises:
designating a last column of the memory cell array as the first portion of the memory cell array, such that each one of the N word lines connects to a corresponding monitoring memory cell; and
designating columns of the memory cell array other than the last column as the second portion of the memory cell array, such that each one of the programming units is respectively connected to one of the N word lines and uniquely associated for purposes of the preliminary read operation with the corresponding monitoring memory cell.

7. The method of claim 6, wherein the corresponding monitoring memory cell initially stores a target data state equal to one of the plurality of data states.

8. The method of claim 7, wherein the corresponding monitoring memory cell initially stores a target data state equal to a highest one of the plurality of data states.

9. The method of claim 3, wherein the memory cell array comprises N word lines arranged to connect the multi level cells, and the method further comprises:
designating a last column of the memory cell array as the first portion of the memory cell array, such that each one of the N word lines connects to a corresponding plurality of monitoring memory cells; and
designating columns of the memory cell array other than the last column as the second portion of the memory cell array, such that each one of the programming units is respectively connected to one of the N word lines and uniquely associated for purposes of the preliminary read operation with the corresponding plurality of monitoring memory cells.

10. The method of claim 9, wherein each one of the corresponding plurality of monitoring memory cells initially stores a different target data state equal to one of the plurality of data states.

11. The method of claim 10, wherein a number of the corresponding plurality of monitoring memory cells is the same as a number of the plurality of data states.

12. The method of claim 3, wherein the memory cell array comprises N word lines arranged to connect the multi level cells, each one of the N word lines respectively defining one of N rows of the memory cell array, and the method further comprising:
designating a last row of the memory cell array as the first portion of the memory cell array, such that only a last one of the N word lines connects to the monitoring memory cells; and
designating rows of the memory cell array other than the last row as the second portion of the memory cell array, such that each one of the programming units is respectively connected to one of the N word lines other than the last one of the N word lines.

13. The method of claim 3, wherein the memory cell array comprises N word lines arranged to connect the multi level cells, and the method further comprises:
designating a last column of the memory cell array as the first portion of the memory cell array, and designating columns of the memory cell array other than the last column as the second portion of the memory cell array; and
connecting only a single one of the N word lines to the monitoring memory cells disposed in the last column.

14. A method of performing a main read operation directed to multi level memory cells arranged in a memory cell array of a non-volatile memory device, wherein each multi level cell is configured to store one of a plurality of data states according to a corresponding plurality of threshold voltage distributions, the method comprising:
designating a first portion of the memory cell array to include a monitoring memory cell and a second portion of the memory cell array to include a programming unit uniquely associated in the memory cell array with the monitoring memory cell;
defining a main read voltage for use during the main read operation by iteratively applying a plurality of preliminary read voltages according to descending voltage level to the monitoring memory cell initially storing a first data state selected from the plurality of data states, until one of the plurality of preliminary read voltages discriminates the first data state from a second data state selected from the plurality of data states, wherein each one of the plurality of preliminary read voltages has a voltage level between a first threshold voltage distribution corresponding to the first data state and a second threshold voltage distribution adjacent to the first threshold voltage distribution and corresponding to the second data state;

setting the main read voltage to the one of the plurality of preliminary read voltages discriminating between the first data state and the second data state; and performing the main read operation directed to the programming unit.

15. The method of claim 14, further comprising:
designating a last column of the memory cell array as the first portion of the memory cell array and designating columns of the memory cell array other than the last column as the second portion of the memory cell array.

16. The method of claim 14, wherein the first data state is a highest data state in the plurality of data states.

17. The method of claim 14, further comprising:
designating a last row of the memory cell array as the first portion of the memory cell array, and designating rows of the memory cell array other than the last row as the second portion of the memory cell array.

18. The method of claim 14, wherein the memory cell array comprises of N word lines arranged to connect the multi level cells, and the method further comprises:
designating a last column of the memory cell array as the first portion of the memory cell array, and designating columns of the memory cell array other than the last column as the second portion of the memory cell array; and
connecting only a single one of the N word lines to the monitoring memory cell disposed in the last column.

19. The method of claim 1, wherein said setting comprises setting the main read voltage to the first read voltage when the data state read from the monitoring memory cell is determined by said comparing to be the same as the target data state.

20. A method of driving a non-volatile memory device including a memory cell array, the method comprising:
designating a first portion of the memory cell array to include monitoring memory cells, and a second portion of the memory cell array to include programming units of multi level cells, each multi level cell being configured to store one of a plurality of data states according to a corresponding plurality of threshold voltage distributions;
performing a first preliminary read operation directed to the monitoring memory cells using at least a first read voltage, wherein the preliminary read operation discriminates between a first data state and a second data state using the first read voltage;
performing a first comparison comparing a read-out data during the first preliminary read operation with a reference value to generate a first comparison result; and
setting a main read voltage for reading the programming units responsive to the first comparison result.

21. The method of claim 20, further comprising:
after setting the main read voltage, performing a main read operation directed to at least one of the programming units using the main read voltage.

22. The method of claim 20, further comprising:
changing a level of the first read voltage in responsive to the first comparison result to provide a second read voltage;
performing a second preliminary read operation directed to the monitoring memory cells using at least the second read voltage, wherein the second preliminary read operation discriminates between the first data state and the second data state using the second read voltage; and
performing a second comparison, comparing the read-out data during the second preliminary read operation with the reference value to generate a second comparison result.

23. The method of claim 22, wherein the main read voltage is set in response to at least one of the second read voltage and the second comparison result.

24. The method of claim 22, further comprising:
successively changing a level of a read voltage derived from the first and second read voltage, then performing a corresponding preliminary read operation, and then performing a corresponding comparison until a comparison result is equal to a predetermined value.

25. The method of claim 22, wherein changing the level of the first read voltage comprises either increasing or decreasing the level of the first read voltage in response to the first comparison result.

26. The method of claim 20, wherein a level of the first read voltage is selected from a plurality of read voltage having different levels, such that any one of the plurality of first read voltages may be set as the main read voltage in responsive to the first comparison result.

27. The method of claim 20, wherein the preliminary read operation directed to the monitoring memory cells is further performed using another read voltage, and the preliminary read operation discriminates between a third data state and a fourth data state using the another read voltage.

28. A method of driving a non-volatile memory device including a memory cell array, the method comprising:
designating a first portion of the memory cell array to include monitoring memory cells, and a second portion of the memory cell array to include programming units of multi level cells, each multi level cell being configured to store one of a plurality of data states according to a corresponding plurality of threshold voltage distributions;
successively performing a preliminary read operation directed to the monitoring memory cells using a read voltage, and a comparison operation comparing read-out data obtained during the preliminary read operation with a reference value to generate a corresponding comparison result, wherein a level of the read voltage is changed with each successive performance of the preliminary read operation and the comparison operation in response to the corresponding comparison result; and
setting a main read voltage used to read the programming units based on at least two read voltages having different levels as obtained by the successive performance of the preliminary read operation and the comparison operation.

29. The method of claim 28, continuing the successive performance of the preliminary read operation and the comparison operation until the read-out data is equal to the reference value.

30. The method of claim 28, wherein the level of the read voltage increases or decreases for each successive performance of the preliminary read operation and the comparison operation in response to a corresponding comparison result.

* * * * *